United States Patent
Oh (10) Patent No.: US 7,834,549 B2
(45) Date of Patent: Nov. 16, 2010

(54) ORGANIC LIGHT EMITTING DISPLAY DEVICE AND METHOD OF FABRICATING THE SAME

(75) Inventor: Sang-Hun Oh, Suwon-si (KR)

(73) Assignee: Samsung Mobile Display Co., Ltd. (KR)

( * ) Notice: Subject to any disclaimer, the term of this patent is extended or adjusted under 35 U.S.C. 154(b) by 528 days.

(21) Appl. No.: 11/440,500

(22) Filed: May 24, 2006

(65) Prior Publication Data

US 2006/0267492 A1    Nov. 30, 2006

(30) Foreign Application Priority Data

May 27, 2005    (KR)    ............ 10-2005-0045159

(51) Int. Cl.
*H01J 1/62* (2006.01)
*H01J 63/04* (2006.01)

(52) U.S. Cl. ............ 313/512; 313/483; 313/500; 313/504; 313/505; 313/506

(58) Field of Classification Search ............ None
See application file for complete search history.

(56) References Cited

U.S. PATENT DOCUMENTS

| | | | |
|---|---|---|---|
| 4,238,704 A | 12/1980 | Bonk et al. | |
| 6,555,025 B1 | 4/2003 | Krupetsky et al. | |
| 6,822,264 B2* | 11/2004 | Yamazaki et al. | ............ 257/79 |
| 7,129,523 B2* | 10/2006 | Yamazaki et al. | ............ 257/59 |
| 7,446,336 B2* | 11/2008 | Yamazaki et al. | ............ 257/59 |
| 2004/0263740 A1 | 12/2004 | Sakakura et al. | |
| 2005/0045891 A1* | 3/2005 | Yamazaki et al. | ............ 257/72 |
| 2005/0046346 A1* | 3/2005 | Tsuchiya et al. | ............ 313/509 |
| 2007/0170840 A1* | 7/2007 | Chang-Hae et al. | ............ 313/503 |
| 2007/0170859 A1* | 7/2007 | Choi et al. | ............ 313/512 |

FOREIGN PATENT DOCUMENTS

| | | |
|---|---|---|
| CN | 1578546 A | 2/2005 |
| JP | 09-278483 | 10/1997 |
| JP | 10-074583 | 3/1998 |
| JP | 2003-167258 | 6/2003 |

(Continued)

OTHER PUBLICATIONS

Chinese Office Action issued Apr. 4, 2008 in corresponding Chinese Patent Application No. 200610093705.8.

(Continued)

*Primary Examiner*—Nimeshkumar D. Patel
*Assistant Examiner*—Natalie K Walford
(74) *Attorney, Agent, or Firm*—Knobbe Martens Olson & Bear LLP (57) ABSTRACT

An organic light emitting display device (OLED) and a method of fabricating the same are disclosed. The organic light emitting display (OLED) device includes: a first substrate having a pixel region and a non-pixel region; an inorganic insulating layer disposed over the first substrate; a planarization layer disposed over the inorganic insulating layer; a second substrate placed over the first substrate; and a sealant connecting to the second substrate and contacting the inorganic insulating layer through a portion of the planarization layer located in the non-pixel region. This configuration improves the adhesion of a sealant, thus reducing damages to an organic light emitting diode in the OLED.

10 Claims, 6 Drawing Sheets

FOREIGN PATENT DOCUMENTS

| | | |
|---|---|---|
| JP | 2003-167528 | 6/2003 |
| JP | 2004-102246 | 4/2004 |
| JP | 2004-335267 | 11/2004 |
| JP | 2005-049808 | 2/2005 |
| JP | 2005-108824 | 2/2005 |
| KR | 10 2003 0081991 | 10/2003 |
| KR | 2005092934 A * | 9/2005 |
| SI | 2004 10076977 | 3/2005 |
| WO | WO 2004/068446 | 8/2004 |

OTHER PUBLICATIONS

Japanese Office Action issued Apr. 14, 2009 in corresponding Japanese Patent Application No. 2006-145660.

Chinese Office Action issued Jul. 10, 2009 in corresponding China Application 200610093705.8.

* cited by examiner

ORGANIC LIGHT EMITTING DISPLAY DEVICE AND METHOD OF FABRICATING THE SAME

CROSS-REFERENCE TO RELATED APPLICATIONS

This application claims priority to and the benefit of Korean Patent Application No. 10-2005-0045159, filed May 27, 2005, the disclosure of which is incorporated herein by reference in its entirety.

BACKGROUND OF THE INVENTION

1. Field of the Invention

The present invention relates to an organic light emitting display (OLED) device and a method of fabricating the same, and more particularly, to an OLED device having an improved sealing structure and a method of fabricating the same.

2. Description of the Related Technology

Figure 1:
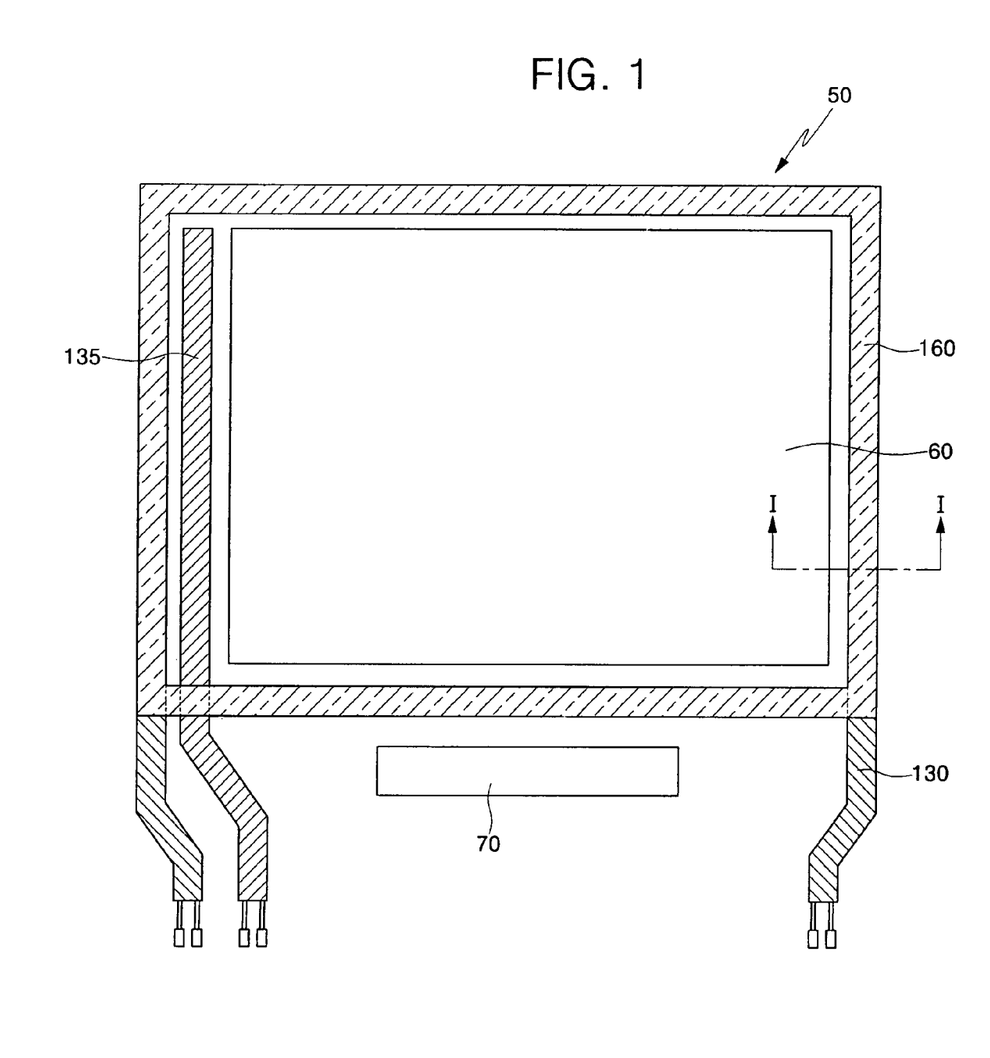
FIG. 1 is a top plan view of a conventional organic light emitting display (OLED) device, showing a sealant, a common power supply (Vdd) line, and a second electrode power supply line.

FIG. 1 is a plan view of a conventional organic light emitting display (OLED) device. The OLED device 50 includes a pixel region 60 and a non-pixel region surrounding the pixel region. The pixel region 60 includes a plurality of pixels (not shown). The non-pixel region includes a common power supply (Vdd) line 130, a driving integrated circuit 70, a second electrode power supply line 135, and a sealant 160.

The common power supply line 130 is arranged on top and both sides of the pixel region 60, as shown in FIG. 1. The common power supply line 130 is used to supply a voltage to circuits in the pixel region.

The driving integrated circuit (IC) 70 includes a data driver (not shown) and a scan driver (not shown). The data driver is configured to output a data signal to drive the pixels in the pixel region 60. The scan driver is configured to output a selection signal to the pixels in the pixel region 60.

The second electrode power supply line 135 is disposed on one side of the pixel region 60. The second electrode power supply line 135 is connected to a second electrode (not shown) disposed over the second electrode power supply line 135. The second electrode power supply line 135 receives a second electrode voltage from an external terminal and applies the second electrode voltage to the second electrode through a contact hole (not shown).

The sealant 160 surrounds the pixel region 60 and overlaps with the common power supply (Vdd) line 130. The sealant 160 attaches upper and lower substrates to each other.

In the conventional OLED device 50 described above, when the scan driver of the driving IC 70 transmits the selection signal to the pixel region 60, the data driver of the driving IC 70 transmits the data signal to the pixel region 60, the common power supply (Vdd) line 130 applies the power supply voltage, and the second electrode power supply line 135 applies the second electrode voltage to the second electrode, a switching transistor (not shown) and a driving transistor (not shown) of each of pixels arranged in the pixel region 60 are driven so that an organic light emitting diode (not shown) emits light.

Figure 2:
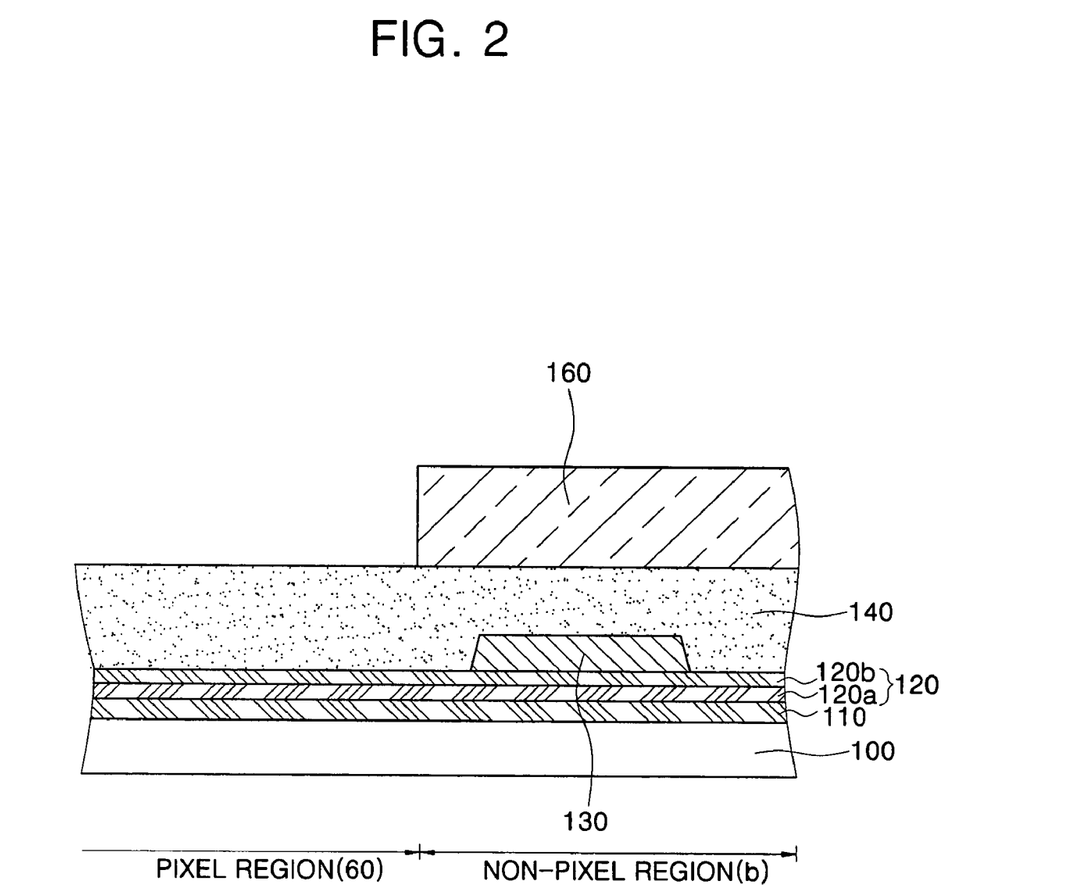
FIG. 2 is a cross-sectional view taken along the line I-I of FIG. 1, which illustrates the sealant formed in the conventional OLED device.

FIG. 2 is a cross-sectional view taken along the line I-I of FIG. 1, which illustrates the sealant structure of the conventional OLED device. Referring to FIG. 2, the conventional OLED device includes a substrate 100 having a pixel region 60 and a non-pixel region b. A gate insulating layer 110 is formed on the surface of the substrate 100.

Also, an interlayer insulating layer 120 is formed on the surface of the gate insulating layer 110. The interlayer insulating layer 120 may include a silicon oxide ($SiO_2$) layer, a silicon nitride (SiNx) layer, or both layers stacked over each other. In one embodiment, the silicon oxide ($SiO_2$) layer and the silicon nitride (SiNx) layer may be stacked separately. For example, a first interlayer insulating layer 120a may be formed by stacking a silicon oxide ($SiO_2$) layer over the gate insulating layer 110 and annealing the silicon oxide ($SiO_2$) layer at a temperature of about 430° C. for about four hours. A second interlayer insulating layer 120b may be formed by stacking a silicon nitride (SiNx) layer over the silicon oxide layer and hydrogenating the silicon nitride (SiNx) layer at a temperature of about 380° C.

Thereafter, a common power supply (Vdd) line 130 is formed on the interlayer insulating layer 120 in the non-pixel region b. The common power supply (Vdd) line 130 may be formed of the same material as source and drain electrodes (not shown) of the OLED. For example, the common power supply (Vdd) line 130 may be formed of one selected from the group consisting of molybdenum (Mo), tungsten (W), tungsten molybdenum (MoW), tungsten silicide ($WSi_2$), molybdenum silicide ($MoSi_2$), and aluminum (Al).

Thereafter, a planarization layer 140 is formed on the common power supply (Vdd) line 130. The planarization layer 140 is typically formed of one organic material selected from the group consisting of polyimide (PI), polyamide (PA), acryl resin, benzocyclobutene (BCB), and phenol resin.

In addition, a sealing portion is formed on an upper sealing substrate (not shown), and a sealant 160 is formed in the sealing portion. There is a vacancy on one side of the sealant 160 over the planarization layer 140. The vacancy may be filled with fillers. In one embodiment, the sealant 160 may be formed of a material that is curable by ultraviolet (UV) light or heat.

Upper and lower insulating substrates are bonded to each other so that the pixel region 60 formed on the lower substrate is protected from external moisture and gases. In this case, the sealant 160 is attached onto a portion of the planarization layer 140 over the common power supply (Vdd) line 130.

However, in this case, since the sealant 160 is an organic polymer that is in a liquid or plastic phase, the sealant 160 is very likely to spread when the substrates are pressed against each other. In other words, when the upper and lower substrates are brought into contact with each other, a physical force is applied to the sealant 160. This may cause the sealant 160 to spread into devices (not shown) formed in the pixel region 60. In this case, the devices formed in the pixel region 60 may sustain damages due to the sealant 160.

In addition, in the above-described sealing structure, the adhesion between the organic planarization layer 140 and the sealant 160 is unreliable. Thus, moisture or impurities may permeate into the pixel region 60 from outside, and thus may damage the devices in the pixel region, adversely affecting the reliability of the product. Therefore, there is a need to provide a sealing structure to prevent these problems.

SUMMARY OF CERTAIN INVENTIVE ASPECTS

One aspect of the invention provides an organic light emitting display (OLED) device. The device comprises: a first substrate having a pixel region and a non-pixel region; an inorganic insulating layer disposed over the first substrate; a planarization layer disposed over the inorganic insulating layer; a second substrate placed over the first substrate; and a sealant connecting to the second substrate and contacting the inorganic insulating layer, the sealant comprising a portion penetrating through the planarization layer located in the non-pixel region.

The inorganic insulating layer may comprise one or more layers comprising at least one material selected from the group consisting of silicon oxide ($SiO_2$) and silicon nitride ($SiN_x$). The OLED device may further comprise: a gate insulating layer disposed over a substantially entire surface of the substrate; and a power supply (Vdd) line formed over the gate insulating layer in the non-pixel region of the first substrate, wherein the inorganic insulating layer is formed over the gate insulating layer and the power supply line.

The power supply line may not vertically overlap with the sealant. The OLED device may further comprise a second electrode power supply line disposed over the inorganic insulating layer, at least a portion of the second electrode power supply line vertically overlapping with the power supply (Vdd) line. The pixel region may comprise a thin film transistor comprising a gate electrode, and the power supply line may comprise the same material as that of the gate electrode.

At least a portion of the power supply line may vertically overlap with the sealant. The OLED device may further comprise a second electrode power supply line disposed over the inorganic insulating layer, wherein the second electrode power supply line does not vertically overlap with the power supply (Vdd) line. The sealant may comprise a light-curable epoxy resin or heat-curable epoxy resin. The planarization layer may comprise an organic material.

Another aspect of the invention provides a method of fabricating an organic light emitting display (OLED) device. The method comprises: providing a substrate having a pixel region and a non-pixel region; forming an inorganic insulating layer over the substrate; forming a planarization layer over the inorganic insulating layer; forming an opening in the planarization layer in the non-pixel region to expose the inorganic insulating layer; and filling a sealant in the opening such that the sealant contacts the inorganic insulating layer.

The inorganic insulating layer may comprise one or more layers comprising at least one material selected from the group consisting of silicon oxide ($SiO_2$) and silicon nitride ($SiN_x$). The method may further comprise forming a wall of the sealant over the planarization layer, wherein the wall of the sealant is integral with the sealant filled in the opening.

The method may further comprise: placing a plate over the substrate such that the plate contacts the wall of the sealant; and curing the sealant filled in the opening and the sealant comprising the wall. The method may further comprise, prior to forming the inorganic insulating layer: forming a gate insulating layer over the substantially entire surface of the substrate; and forming a power supply line over the gate insulating layer in the non-pixel region. The method may further comprise forming a gate electrode over the gate insulating layer in the pixel region prior to forming the inorganic insulating layer, wherein the gate electrode and the power supply line are simultaneously formed.

The opening may not vertically overlap with the power supply line. The method may further comprise forming a second electrode power supply line over the inorganic insulating layer in the non-pixel region, at least a portion of the second electrode power supply line vertically overlapping with the power supply (Vdd) line. The method may further comprise forming source and drain electrodes over the inorganic insulating layer in the pixel region, and the second electrode power supply line and the source and drain electrodes are simultaneously formed.

At least a portion of the opening may vertically overlap with the power supply line. The method may further comprise forming a second electrode power supply line over the inorganic insulating layer in the non-pixel region, wherein the second power supply line does not vertically overlap with the power supply (Vdd) line.

Another aspect of the invention provides an organic light emitting display (OLED) and a method of fabricating the same that change the structure of a common power supply (Vdd) line and the structure of an organic planarization layer to ensure a sealant region that is in contact with an inorganic insulating layer, thereby improving the adhesion of a sealant and reducing the damage of an organic light emitting diode.

Yet another aspect of the invention provides an OLED which includes: a substrate having a pixel region and a non-pixel region; an inorganic insulating layer disposed on the substrate; an organic layer disposed on the inorganic insulating layer in the non-pixel region and having an opening to expose a portion of a surface of the inorganic insulating layer; and a sealant contacting the inorganic insulating layer through the opening of the organic layer.

Another aspect of the invention provides an OLED which includes: a substrate having a pixel region and a non-pixel region; a gate insulating layer disposed on the entire surface of the substrate; a common power supply (Vdd) line formed on the gate insulating layer in the non-pixel region; an inorganic insulating layer disposed on the entire surface of the substrate having the common power supply line; a planarization layer disposed on the inorganic insulating layer in the non-pixel region, spaced a predetermined distance apart from the common power supply line, and having an opening to expose a portion of a surface of the inorganic insulating layer; and a sealant contacting the inorganic insulating layer through the opening of the planarization layer.

Another aspect of the invention provides an OLED which includes: a substrate having a pixel region and a non-pixel region; a gate insulating layer disposed on the entire surface of the substrate; a common power supply line formed on the gate insulating layer in the non-pixel region; an inorganic insulating layer disposed on the entire surface of the substrate having the common power supply line; a planarization layer disposed on a top surface of the inorganic insulating layer corresponding to the common power supply line in the non-pixel region and having an opening to expose a portion of a surface of the inorganic insulating layer; and a sealant contacting the inorganic insulating layer through the opening of the planarization layer.

Yet another aspect of the invention provides a method of fabricating an OLED which includes: providing a substrate having a pixel region and a non-pixel region; forming a gate insulating layer on the entire surface of the substrate; forming a common power supply line on the gate insulating layer in the non-pixel region at the same time when a gate electrode is formed in the pixel region; forming an inorganic insulating layer on the entire surface of the substrate having the common power supply line; forming a planarization layer on the inorganic insulating layer in the non-pixel region to be spaced apart from the common power supply line by a predetermined distance, the planarization layer having an opening to expose a portion of a surface of the inorganic insulating layer; and forming a sealant contacting the inorganic insulating layer through the opening of the planarization layer.

Another aspect of the invention provides a method of fabricating an OLED which includes: providing a substrate having a pixel region and a non-pixel region; forming a gate insulating layer on the entire surface of the substrate; forming a common power supply line on the gate insulating layer in the non-pixel region at the same time as when a gate electrode is formed in the pixel region; forming an inorganic insulating layer on the entire surface of the substrate having the common power supply line; forming a planarization layer on a top surface of the inorganic insulating layer corresponding to the common power supply line in the non-pixel region, the planarization layer having an opening to expose a portion of a surface of the inorganic insulating layer; and forming a sealant contacting the inorganic insulating layer through the opening of the planarization layer.

BRIEF DESCRIPTION OF THE DRAWINGS

The above and other features of the invention will be described in reference to certain exemplary embodiments thereof with reference to the attached drawings in which.

DETAILED DESCRIPTION OF CERTAIN INVENTIVE EMBODIMENTS

The present invention will now be described more fully hereinafter with reference to the accompanying drawings, in which exemplary embodiments of the invention are shown.

Figure 3:
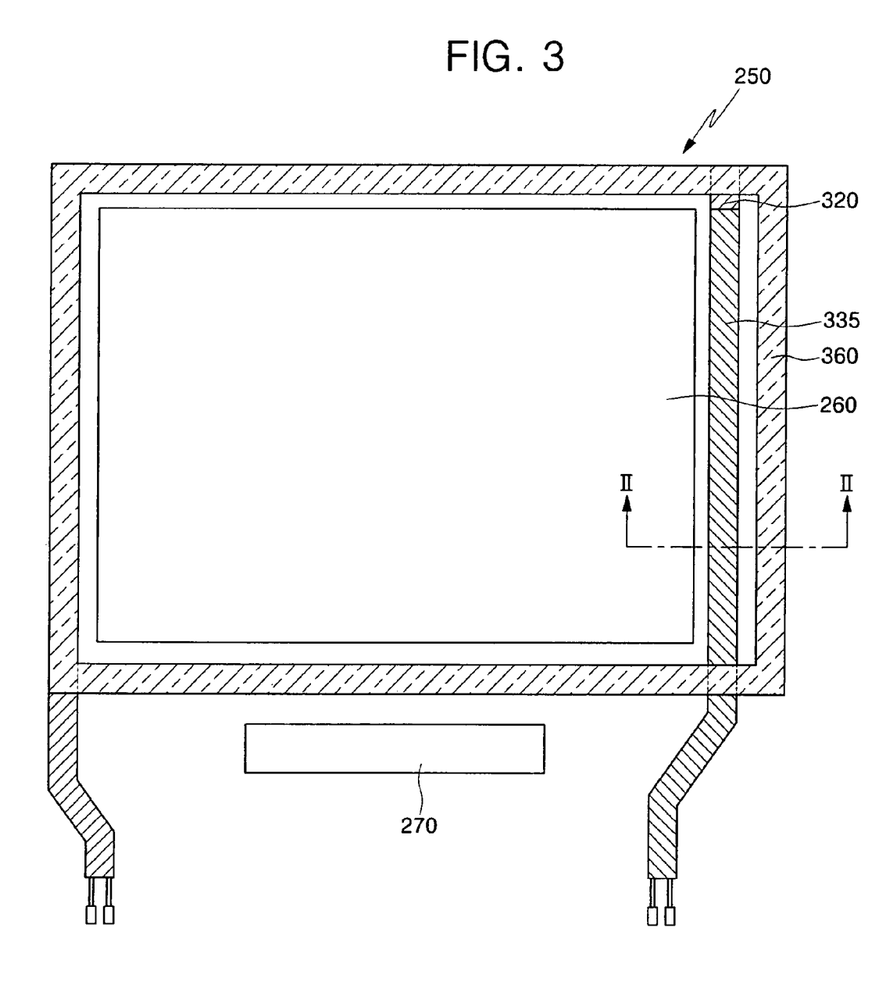
FIG. 3 is a plan view of an OLED device according to an embodiment, which shows a sealant, a common power supply (Vdd) line, and a second electrode power supply line.

FIG. 3 is a plan view of an OLED device 250 according to an embodiment in which a sealant, a common power supply (Vdd) line, and a second electrode power supply line are formed.

Referring to FIG. 3, the OLED device 250 includes a pixel region 260 having a plurality of pixels, a common power supply (Vdd) line 320, and a driving IC 270. Each of the pixels formed in the pixel region 260 includes a thin film transistor (TFT) and an organic light emitting diode (not shown). The TFT is configured to drive the organic light emitting diode. The organic light emitting diode includes an anode, a cathode, and a plurality of layers, such as a hole injection layer (HIL), a hole transport layer (HTL), an emission layer (EML), an electron transport layer (ETL), and an electron injection layer (EIL). The common power supply (Vdd) line 320 is arranged on top and both sides of the pixel region 260 and applies a power supply voltage. The driving IC 270 includes a data driver (not shown) for outputting a data signal and a scan driver (not shown) for outputting a selection signal to drive the pixel region 260.

The OLED device 250 further includes a second electrode power supply line 335. The second electrode power supply line 335 is formed on one side of the pixel region 260. The second electrode power supply line 335 vertically overlaps with the common power supply (Vdd) line 320. The second electrode power supply line 335 is connected to a second electrode (not shown) formed on the second electrode power supply line 335. The second electrode power supply line 335 receives a second electrode voltage from an external terminal and applies the second electrode voltage to the second electrode through a contact hole (not shown). Thus, an IR drop can be prevented by the second electrode power supply line 335.

Also, a sealant 360 is disposed to surround the pixel region 260 and bond upper and lower substrates.

In the OLED device 250 having the above-described construction, when the scan driver (not shown) of the driving IC 270 transmits a selection signal to the pixel region 260, the data driver (not shown) of the driving IC 270 transmits a data signal to the pixel region 260, the common power supply (Vdd) line 320 applies a power supply voltage, and the second electrode power supply line 335 applies a second electrode voltage to the second electrode (not shown), a switching transistor (not shown) and a driving transistor (not shown) of each of the pixels arranged in the pixel region 260 are driven so that the organic light emitting diode emits light.

Figure 4:
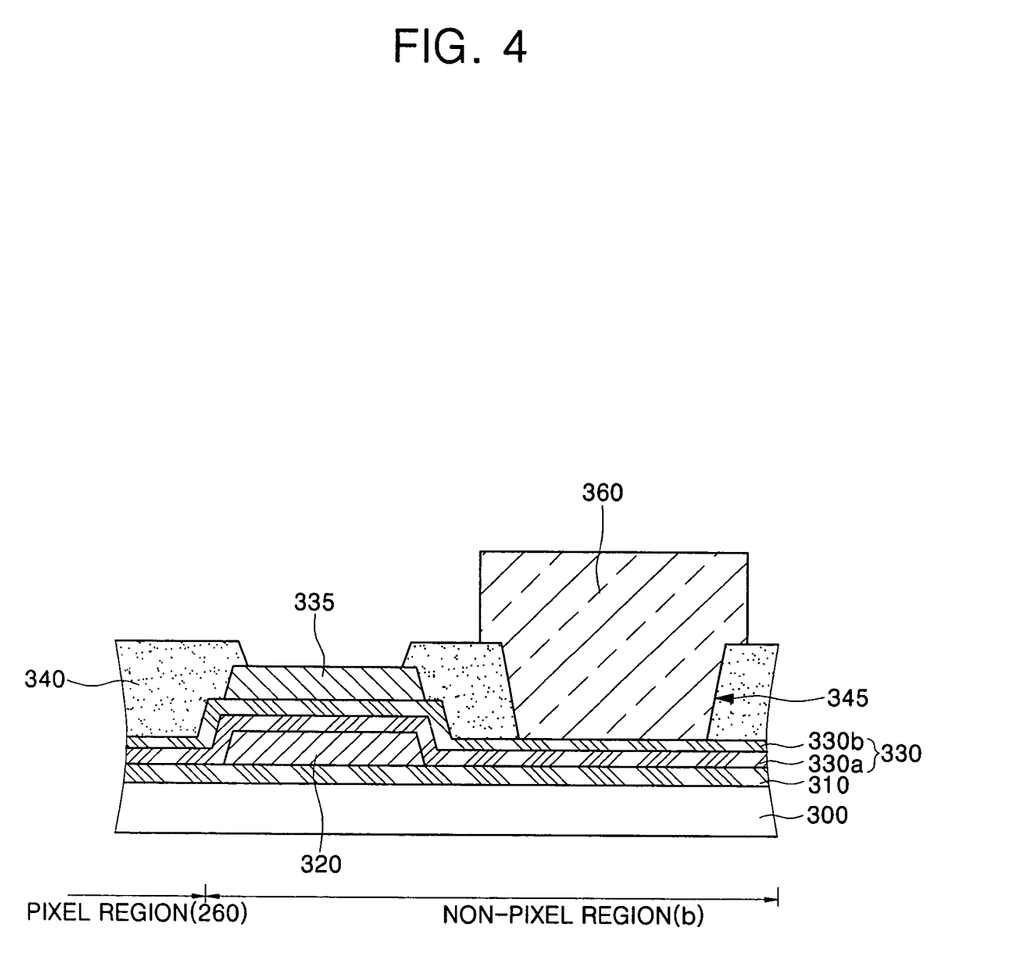
FIG. 4 is a cross-sectional view taken along the line II-II of FIG. 3, which illustrates the sealant formed in the OLED device.

FIG. 4 is a cross-sectional view taken along the line II-II of FIG. 3, which illustrates the sealant formed in the OLED device. Referring to FIG. 4, the illustrated OLED device includes a substrate 300, an inorganic insulating layer 330, a planarization layer 340, and the sealant 360. The substrate 300 includes a pixel region 260 and a non-pixel region b.

The planarization layer 340 is formed over the inorganic insulating layer 330. The planarization layer 340 has an opening 345 to expose a portion of a surface of the inorganic insulating layer 330. The sealant 360 is in contact with the inorganic insulating layer 330 through the opening 345. The planarization layer 340 may be formed of an organic material.

The inorganic insulating layer 330 may include a silicon oxide ($SiO_2$) layer, a silicon nitride (SiNx) layer, or both stacked over each other. In one embodiment, the inorganic insulating layer 330 may include a silicon oxide ($SiO_2$) layer and a silicon nitride (SiNx) layer stacked over each other.

The illustrated OLED device includes the substrate 300 having the pixel region 260 and the non-pixel region b. The substrate 300 may be a transparent substrate. The substrate 300 may be formed of glass, quartz, or a plastic material. A gate insulating layer 310 may be formed over the surface of the substrate 300. The gate insulating layer 310 may include a silicon nitride (SiNx) layer, a silicon oxide (SiO2) layer, or both stacked over each other. The gate insulating layer 310 may be formed by a plasma-enhanced chemical vapor deposition (PECVD) process or a low-pressure CVD (LPCVD) process.

In one embodiment, a common power supply (Vdd) line 320 is formed over the gate insulating layer 310 in the non-pixel region b. The common power supply (Vdd) line 320 may be formed by depositing the same material as a gate electrode material. The common power supply line may be formed simultaneously with forming a gate electrode (not shown) over the gate insulating layer in the pixel region 260. The gate electrode material may be one selected from the group consisting of molybdenum (Mo), tungsten (W), tungsten molybdenum (MoW), tungsten silicide (WSi2), molybdenum silicide (MoSi2), and aluminum (Al).

An inorganic insulating layer 330 may be formed over the substrate 300. The inorganic insulating layer 330 may cover the common power supply (Vdd) line 320. In one embodiment, the inorganic insulating layer 330 may have a two-layered structure having a silicon oxide ($SiO_2$) layer 330a and a silicon nitride (SiNx) layer 330b. In the embodiment, the inorganic insulating layer 330 may be formed by sequentially depositing the silicon oxide layer 330a and the silicon nitride layer 330b and hydrogenating the deposited layers at a temperature of about 380° C.

Subsequently, the planarization layer 340 may be formed over the inorganic insulating layer 330 in the non-pixel region b. An opening 345 is formed in the planarization layer 340. The opening 345 is spaced a predetermined distance apart from the common power supply (Vdd) line 320. The opening exposes a portion of the surface of the inorganic insulating layer 330. The planarization layer 340 may be formed of one organic material selected from the group consisting of acryl resin, Benzo Cyclo Butene (BCB), Polyimide (PI), Polyamide (PA), and phenol resin. After the planarization layer 340 is formed, the planarization layer 340 may be etched by a dry or wet etching process to form the opening 345 that exposes the portion of the surface of the inorganic insulating layer 330.

Subsequently, an encapsulation process is followed. A sealing substrate (not shown) to which the sealant 360 is attached is bonded to the lower substrate 300 having the planarization layer 340. In this case, the sealant 360 is brought into contact with the inorganic insulating layer 330 through the opening 345 of the planarization layer 340. The illustrated sealant 360 is in contact with the silicon nitride (SiNx) layer 330b of the inorganic insulating layer 330. Adhesion between the sealant 360 and the planarization layer 340 can thus be improved.

The sealant 360 is bonded to the opening 345 of the planarization layer 340 during the encapsulation process. Thus, when the sealing substrate is bonded to the lower substrate 300, even if physical force is applied, spreading of the sealant 360 into devices (not shown) of the pixel region 260 may be reduced. Thus, damages to the devices of the pixel region 260 are prevented, enhancing the reliability of the resulting product.

The OLED device may include a gap between the planarization layer 340 and the upper sealing substrate. The gap may be filled with a filler.

In one embodiment, the encapsulation process may be performed using a UV-curing sealant in a dry nitrogen atmosphere. This configuration prevents degradation of the organic light emitting diode formed in the pixel region 260 due to external moisture and oxygen. The upper sealing substrate may be replaced with a polymer film or an SUS thin layer.

In one embodiment, the encapsulation process may include in sequence: a sealing cover cleaning process, a drying agent and film attaching process, a UV sealant dispensing process, a process of bonding the upper sealing substrate to the lower substrate 300 that underwent a layer-forming process, and a UV light curing process. The sealing cover cleaning process is performed under the same conditions as when patterned glass is cleaned. The cleaning process may include in sequence an ultrasonic cleaning process, a UV ozone cleaning process, and a plasma processing process. The sealing cover cleaning process serves to prevent a gas from being generated from a cover after the sealing process and improves adhesion between the cover and a patterned substrate. In most cases, a UV sealant is excellent in adhesion between substrates, but is poor in adhesion between a sealing cover and a substrate. To improve adhesiveness, in one embodiment, the surface of the sealing cover is processed with plasma.

The sealant 360 used for the encapsulation process may be a light-curing or heat-curing epoxy resin. In one embodiment, the UV sealant may be maintained in an appropriate form and is deaerated when the UV sealant is coated. The sealant may be rapidly cured at a low temperature. The sealant may have low contractibility and permeability.

In one embodiment, the UV sealant may have a sufficient viscosity to be maintained in a certain form. When the viscosity of the UV sealant is too high, it is difficult to dispense the UV sealant. One the other hand, when the viscosity of the UV sealant is too low, the UV sealant may flow in a reverse direction after the dispensing process. Also, unless the UV sealant can be maintained in a certain form, when the UV sealant is pressed during the encapsulation process, a device of a display panel may be damaged.

In one embodiment, the UV sealant is mixed with spacers and deaerated. In such an embodiment, the UV sealant may be supplied in a syringe-type container. After the UV sealant dispensing process is finished, the lower substrate 300 is positioned on the cover and is irradiated with UV light through a mask. Thus, the encapsulation process is completed.

In the illustrated embodiment, TFTs (not shown) may be formed in the pixel region 260. Each TFT may include a semiconductor layer (not shown), a gate electrode (not shown), and source and drain electrodes (not shown).

In one embodiment, the second electrode power supply line 335 of FIG. 3 is formed on the inorganic insulating layer 330 over the common power supply (Vdd) line 320. A predetermined voltage may be applied to the second electrode so that an IR drop can be prevented. The second electrode power supply line 335 may be formed over a top surface of the inorganic insulating layer 330. The second electrode power supply line 335 may vertically overlap with the common power supply (Vdd) line 320. This configuration allows an area occupied by the second electrode power supply line 335 to be reduced. Thus, a dead space can be reduced to minimize the entire panel size. The second electrode power supply line 335 may be simultaneously formed with source and drain electrodes (not shown) in the pixel region 260.

Figure 5:
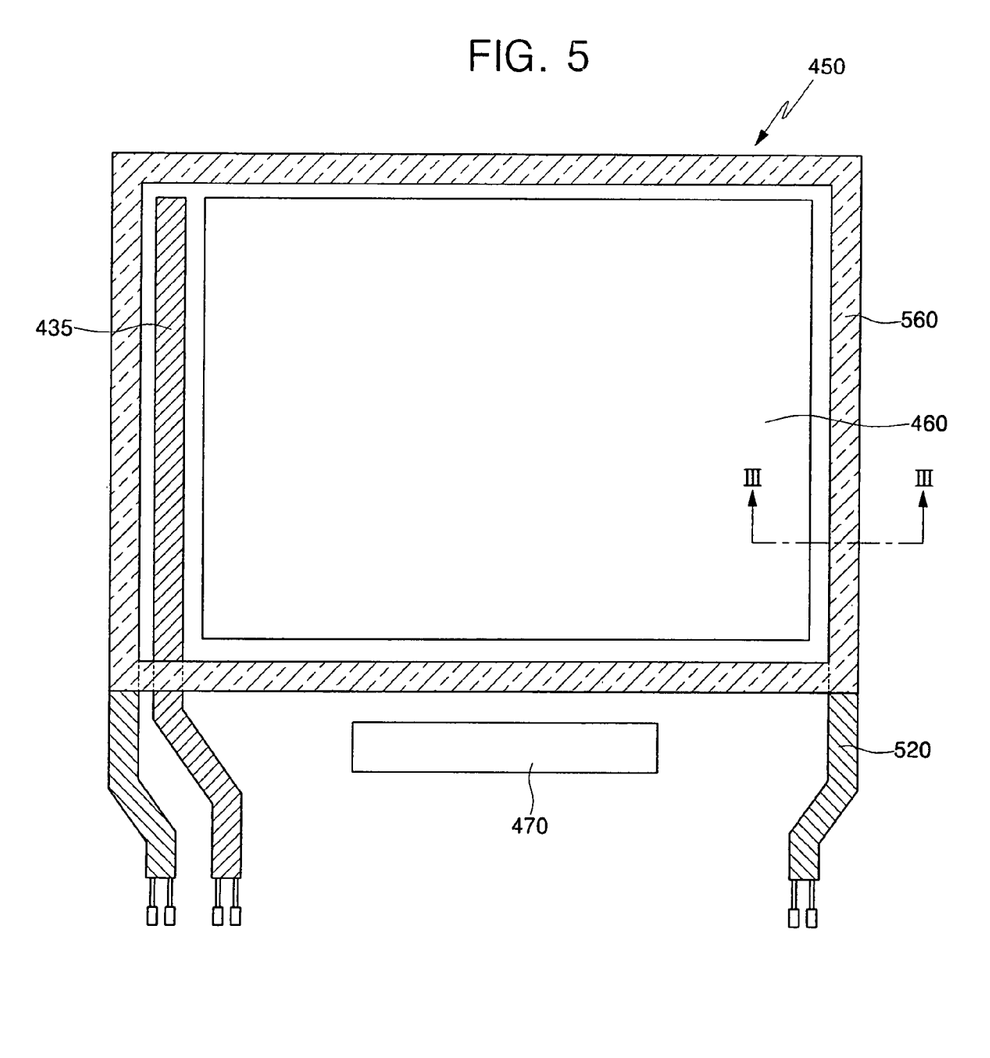
FIG. 5 is a plan view of an OLED device according to another embodiment, which shows a sealant, a common power supply (Vdd) line, and a second electrode power supply line.

FIG. 5 is a plan view of an OLED device according to another embodiment in which a sealant, a common power supply (Vdd) line, and a second electrode power supply line are formed. Referring to FIG. 5, an OLED device 450 may include a pixel region 460 having a plurality of pixels, a common power supply (Vdd) line 520, and a driving IC 470. The common power supply (Vdd) line 520 may be arranged on top and both sides of the pixel region 460 and applies a power supply voltage to the pixel region 460. The driving IC 470 may include a data driver (not shown) for outputting a data signal and a scan driver (not shown) for outputting a selection signal.

In one embodiment, the OLED device 450 may further include a second electrode power supply line 435 disposed on one side of the pixel region 460. The second electrode power supply line 435 may be connected to a second electrode (not shown) formed on the second electrode power supply line 435. The second electrode power supply line 435 is configured to receive a second electrode voltage from an external terminal and applies the second electrode voltage to the second electrode (not shown) through a contact hole (not shown). The second electrode power supply line 435 may be formed when source and drain electrodes (not shown) are formed in the pixel region 460.

In the illustrated embodiment, a sealant 560 surrounds the pixel region 460. The sealant 560 is configured to bond upper and lower substrates.

Figure 6:
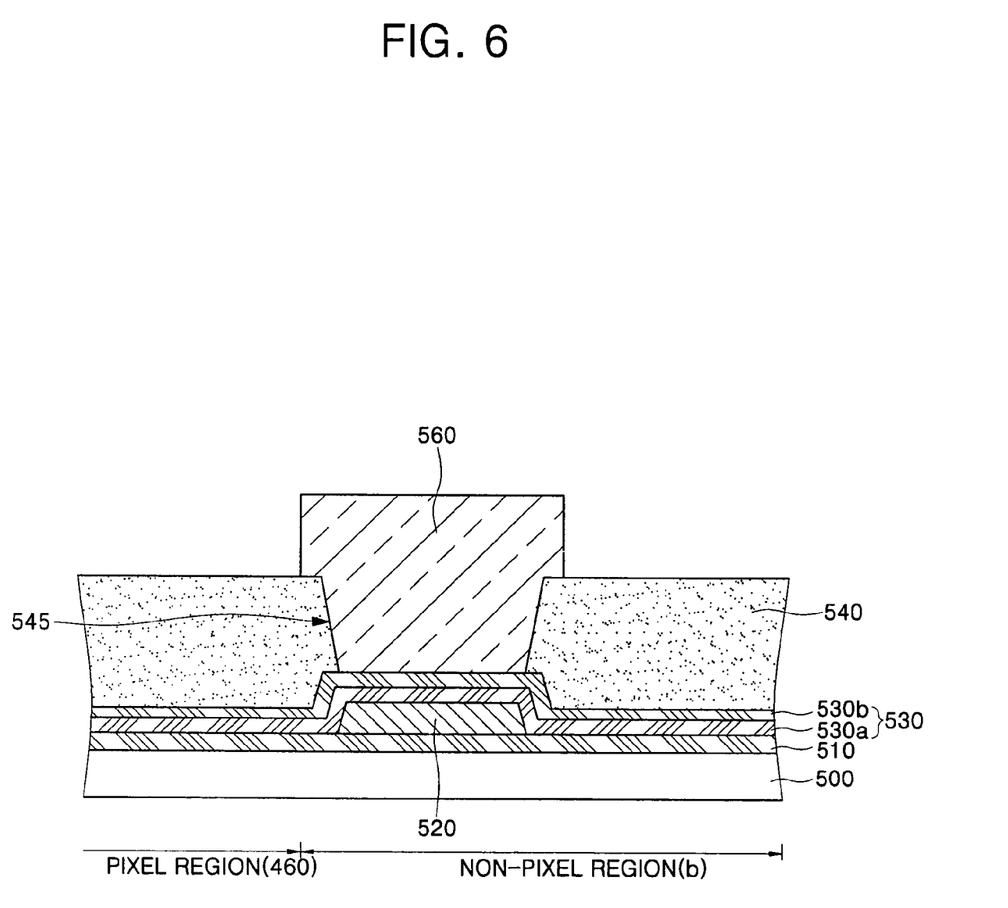
FIG. 6 is a cross-sectional view taken along the line III-III of FIG. 5, which illustrates the sealant formed in the OLED device.

FIG. 6 is a cross-sectional view taken along the line III-III of FIG. 5, which illustrates the sealant formed in the OLED device.

Referring to FIG. 6, the illustrated OLED device includes a substrate 500 having a pixel region 460 and a non-pixel region b. The substrate 500 may be a transparent substrate that is formed of glass, quartz, or a plastic material. A gate insulating layer 510 is formed over a surface of the substrate 500. The gate insulating layer 510 may include a silicon nitride (SiNx) layer and/or a silicon oxide (SiO2) layer. The gate insulating layer 510 may be obtained by a PECVD process or an LPCVD process.

Thereafter, the common power supply (Vdd) line 520 is formed on the gate insulating layer 510 in the non-pixel region b. The common power supply (Vdd) line 520 may be formed by depositing the same material as a gate electrode material. The line may be formed simultaneously with forming a gate electrode (not shown) in the pixel region 460.

An inorganic insulating layer 530 may be formed on the surface of the substrate 500 having the common power supply (Vdd) line 520. The inorganic insulating layer 530 may have a silicon oxide (SiO2) layer 530a and a silicon nitride (SiNx) layer 530b stacked over each other. In one embodiment, the inorganic insulating layer 530 may be formed by sequentially depositing the silicon oxide (SiO2) layer 530a and the silicon nitride (SiNx) layer 530b and hydrogenating the deposited layers at a temperature of about 380° C.

Thereafter, a planarization layer 540 is formed on the inorganic insulating layer 530 in the non-pixel region b. The planarization layer 540 includes an opening 545 formed over the common power supply (Vdd) line 520. The opening 545 exposes a portion of the surface of the inorganic insulating layer 530.

Each of the gate insulating layer 510, the common power supply (Vdd) line 520, the inorganic insulating layer 530, and the planarization layer 540 is formed using the same material and processes as described in the previous embodiment.

Subsequently, an encapsulation process is conducted. A sealing substrate (not shown) to which the sealant 560 is attached is bonded to the lower substrate 500 having the planarization layer 540. In one embodiment, the sealant 560 may be a light-curing or heat-curing epoxy resin. The sealant 560 may be in contact with the inorganic insulating layer 530 through the opening 545 of the planarization layer 540. The sealant 560 may be in contact with the silicon nitride (SiNx) layer of the inorganic insulating layer 530. Thus, adhesion between the sealant 560 and the planarization layer 540 can be improved.

Also, since the sealant 560 is bonded to the opening 545 of the planarization layer 540 during the encapsulation process, when the sealing substrate is in contact with the lower substrate 500, even if physical force is applied, a possibility of permeation of the sealant 560 into an internal device (not shown) in the pixel region 460 may be reduced. Thus, damages to the internal device in the pixel region 460 may be prevented, enhancing the reliability of products.

The OLED device may have a gap between the sealing substrate and the planarization layer 540. The gap may be filled with a filler.

In the illustrated embodiment, although not mentioned for convenience of explanation, a TFT (not shown) including a semiconductor layer (not shown), a gate electrode (not shown), and source and drain electrodes (not shown) may be formed in the pixel region 460.

As described above with respect to the previous embodiment, the common power supply (Vdd) line and the planarization layer have different configurations than the conventional structure. The sealant is in contact with the inorganic insulating layer, which enhances the adhesion between upper and lower substrates. In addition, damages to an organic light emitting diode can be prevented, thus enhancing the reliability of products.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. An organic light emitting display (OLED) device comprising:
   a first substrate having a pixel region and a non-pixel region;
   an inorganic insulating layer disposed over the first substrate;
   a planarization layer disposed over the inorganic insulating layer;
   a second substrate placed over the first substrate; and
   a sealant connecting to the second substrate and contacting the inorganic insulating layer, the sealant comprising a portion penetrating through and contacting the planarization layer between sides of an opening, wherein the opening is located in the non-pixel region.

2. The OLED device of claim 1, wherein the inorganic insulating layer comprises one or more layers comprising at least one material selected from the group consisting of silicon oxide (SiO$_2$) and silicon nitride (SiN$_x$).

3. The OLED device of claim 1, further comprising:
   a gate insulating layer disposed over a substantially entire surface of the substrate; and
   a power supply (Vdd) line formed over the gate insulating layer in the non-pixel region of the first substrate, wherein the inorganic insulating layer is formed over the gate insulating layer and the power supply line.

4. The OLED device of claim 3, wherein the power supply line does not vertically overlap with the sealant.

5. The OLED device of claim 4, further comprising a second electrode power supply line disposed over the inorganic insulating layer, at least a portion of the second electrode power supply line vertically overlapping with the power supply (Vdd) line.

6. The OLED device of claim 3, wherein the pixel region comprises a thin film transistor comprising a gate electrode, and wherein the power supply line comprises the same material as that of the gate electrode.

7. The OLED device of claim 3, wherein at least a portion of the power supply line vertically overlaps with the sealant.

8. The OLED device of claim 7, further comprising a second electrode power supply line disposed over the inorganic insulating layer, wherein the second electrode power supply line does not vertically overlap with the power supply (Vdd) line.

9. The OLED device of claim 1, wherein the sealant comprises a light-curable epoxy resin or heat-curable epoxy resin.

10. The OLED device of claim 1, wherein the planarization layer comprises an organic material.

* * * * *